(12) United States Patent
Park et al.

(10) Patent No.: US 9,594,200 B2
(45) Date of Patent: Mar. 14, 2017

(54) POLARIZER AND METHOD OF FABRICATING THE SAME

(71) Applicant: SAMSUNG DISPLAY CO., LTD., Yongin, Gyeonggi-Do (KR)

(72) Inventors: Seung Won Park, Seoul (KR); Tae Woo Kim, Seoul (KR); Dae Ho Yoon, Hwaseong-si (KR); Moon Gyu Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 91 days.

(21) Appl. No.: 14/667,588

(22) Filed: Mar. 24, 2015

(65) Prior Publication Data

US 2016/0047961 A1    Feb. 18, 2016

(30) Foreign Application Priority Data

Aug. 13, 2014   (KR) .......................... 10-2014-0105137

(51) Int. Cl.
*G02B 5/30* (2006.01)
*G03F 7/00* (2006.01)

(52) U.S. Cl.
CPC ......... *G02B 5/3058* (2013.01); *G03F 7/0007* (2013.01); *G03F 7/0035* (2013.01)

(58) Field of Classification Search
None
See application file for complete search history.

(56) References Cited

U.S. PATENT DOCUMENTS

| 2016/0033701 | A1* | 2/2016 | Yang | G02B 5/3058 |
| | | | | 359/485.05 |
| 2016/0077264 | A1* | 3/2016 | Kang | G03F 7/0002 |
| | | | | 430/321 |
| 2016/0131811 | A1* | 5/2016 | Lee | G02B 5/3058 |
| | | | | 359/485.05 |
| 2016/0154158 | A1* | 6/2016 | Xie | G02B 5/3058 |
| | | | | 359/485.05 |
| 2016/0178822 | A1* | 6/2016 | Kwak | G02B 5/3058 |
| | | | | 257/72 |

FOREIGN PATENT DOCUMENTS

| KR | 10-2005-0033682 A | 4/2005 |
| KR | 10-2008-0035267 A | 4/2008 |
| KR | 10-2009-0106353 A | 10/2009 |
| KR | 10-2011-0101893 A | 9/2011 |
| KR | 10-2014-0137734 A | 12/2014 |

* cited by examiner

*Primary Examiner* — Derek S Chapel
(74) *Attorney, Agent, or Firm* — Lewis Roca Rothgerber Christie LLP

(57) ABSTRACT

A method of fabricating a polarizer, the method including, forming a base substrate by sequentially forming a metal layer, a guide layer, a hard mask layer, a sacrificial layer, and a first photoresist layer on a light-transmitting substrate in a panel area and an alignment key area which are spatially separated from each other, forming a first photoresist layer pattern for forming an alignment key pattern in the alignment key area by patterning the first photoresist layer, forming a sacrificial layer pattern in the alignment key area utilizing the first photoresist layer pattern as a mask, and forming a second photoresist layer on a top surface of the sacrificial layer pattern of the alignment key area before removing the sacrificial layer of an aperture area of the panel area.

13 Claims, 11 Drawing Sheets

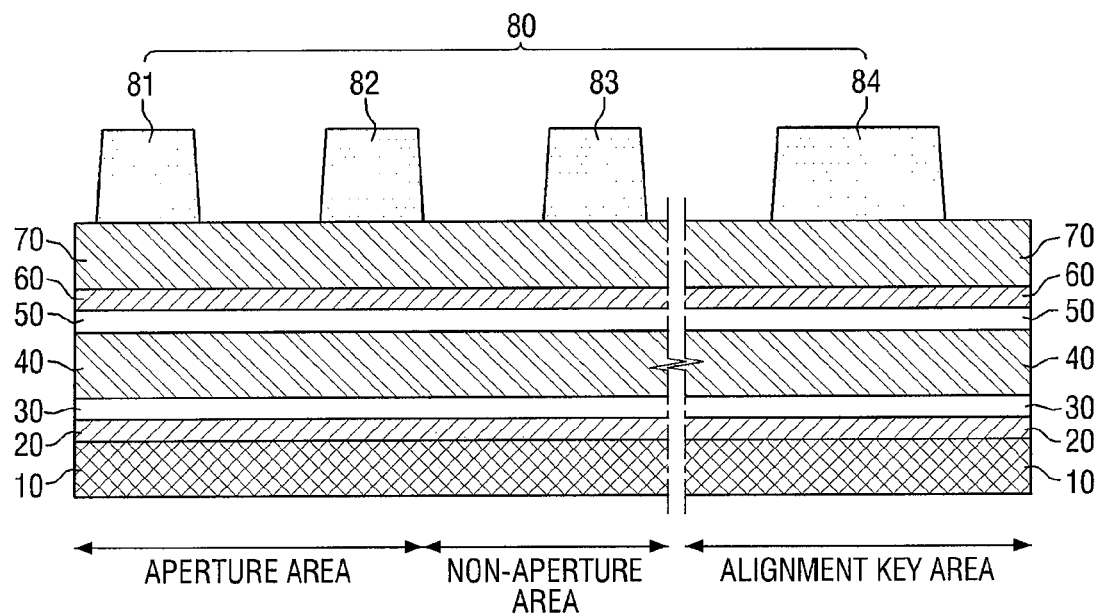
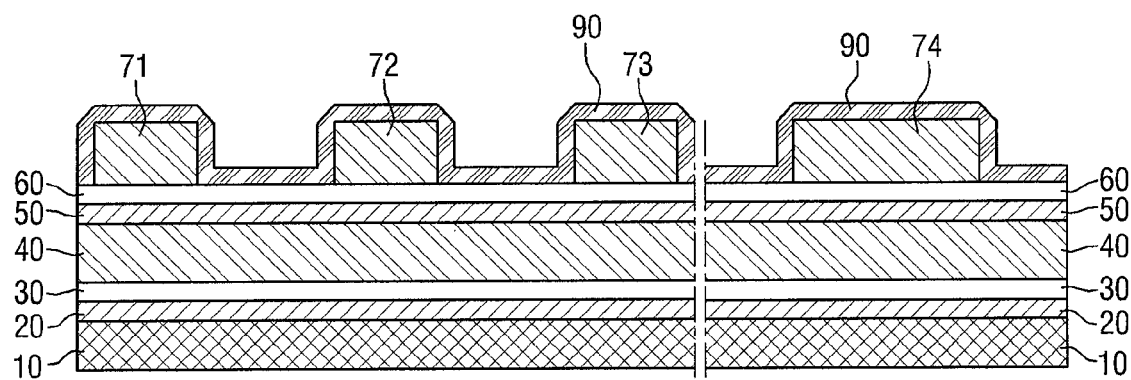

APERTURE AREA | NON-APERTURE AREA | ALIGNMENT KEY AREA

POLARIZER AND METHOD OF FABRICATING THE SAME

CROSS-REFERENCE TO RELATED APPLICATION

This application claims priority to and the benefit of Korean Patent Application No. 10-2014-0105137, filed on Aug. 13, 2014 in the Korean Intellectual Property Office, the disclosure of which is incorporated herein by reference in its entirety.

BACKGROUND

1. Field

The following description relates to a polarizer and a method of fabricating the same.

2. Description of the Related Art

A liquid crystal display (LCD) changes the molecular arrangement of liquid crystals by applying a voltage to the molecular arrangement and displays an image by converting a change in optical properties (such as double refraction, optical rotation, dichroism, and light scattering) of liquid crystal cells, which emit light due to the change in the molecular arrangement, into a visual change.

The LCD includes a polarizer, a panel, an optical sheet, and a backlight assembly to control the molecular arrangement of the liquid crystals. Recently, a structure (an in-cell polarizer) in which the polarizer is placed within the panel has been used.

SUMMARY

It is an aspect of an embodiment of the present invention to prevent an alignment key recognition defect or error from occurring in a process of forming a protective layer, a thin-film transistor, etc. on an in-cell polarizer due to a line width of an alignment key made fine during a process of fabricating the in-cell polarizer.

However, aspects of the present invention are not restricted to the one set forth herein. The above and other aspects of the present invention will become more apparent to one of ordinary skill in the art to which the present invention pertains by referencing the detailed description of the present invention given below.

According to an embodiment of the present invention, there is provided a method of fabricating a polarizer, the method comprising forming a base substrate by sequentially forming a metal layer, a guide layer, a hard mask layer, a sacrificial layer, and a first photoresist layer on a light-transmitting substrate in a panel area and an alignment key area spatially separated from the panel area, forming a first photoresist layer pattern for forming an alignment key pattern in the alignment key area by patterning the first photoresist layer, forming a sacrificial layer pattern in the alignment key area utilizing the first photoresist layer pattern as a mask, and forming a second photoresist layer on a top surface of the sacrificial layer pattern of the alignment key area before removing the sacrificial layer of an aperture area of the panel area.

In one embodiment, the method includes: forming an auxiliary guide layer on the sacrificial layer pattern before the forming of the second photoresist layer on the top surface of the sacrificial layer pattern of the alignment key area; and exposing the top surface of the sacrificial layer pattern and the hard mask layer and forming an auxiliary guide pattern on side surfaces of the sacrificial layer pattern by partially etching the auxiliary guide layer.

In one embodiment, the forming of the second photoresist layer includes forming the second photoresist layer in a non-aperture area of the panel area before removing the sacrificial layer of the aperture area.

In one embodiment, the method includes maintaining the auxiliary guide pattern in the aperture area by removing a sacrificial layer pattern of the aperture area after the forming of the second photoresist layer.

In one embodiment, the method includes: forming a first capping layer between the metal layer and the guide layer; and forming a second capping layer between the hard mask layer and the sacrificial layer.

In one embodiment, the method includes, after removing the sacrificial layer: forming a guide pattern in the panel area by patterning the guide layer of the panel area utilizing an auxiliary guide pattern formed on the guide layer as a second mask; forming a self-assembly pattern in the panel area; and forming a metal layer pattern by patterning the metal layer of the aperture area utilizing the self-assembly pattern as a third mask.

In one embodiment, the forming of the self-assembly pattern includes: coating a block copolymer, which includes a first block and a second block, in the panel area and the alignment key area; heat-treating or solvent-annealing the block copolymer to produce the first block and the second block arranged alternately; and forming the self-assembly pattern by removing one of the first block and the second block.

In one embodiment, the method includes removing all of the guide pattern, a hard mask pattern, the sacrificial layer pattern and the auxiliary guide pattern formed on the metal layer pattern, excluding the metal layer pattern.

According to another embodiment of the present invention, there is provided a method of fabricating a polarizer, the method including forming a base substrate by sequentially forming a metal layer, a guide layer, a hard mask layer, a sacrificial layer, and a first photoresist layer on a light-transmitting substrate in a panel area and an alignment key area spatially separated from the panel area, forming a first photoresist layer pattern for forming an alignment key pattern in the alignment key area by patterning the first photoresist layer, forming a sacrificial layer pattern in the alignment key area utilizing the first photoresist layer pattern as a mask, forming an auxiliary guide layer on the sacrificial layer pattern, and forming a second photoresist layer on the auxiliary guide layer in an area which overlaps the sacrificial layer pattern of the alignment key area before removing the sacrificial layer of an aperture area of the panel area.

In one embodiment, the forming of the second photoresist layer includes forming the second photoresist layer in a non-aperture area before removing the sacrificial layer of the aperture area.

In one embodiment, the method includes exposing a top surface of the sacrificial layer pattern and the hard mask layer in the aperture area and forming an auxiliary guide pattern on side surfaces of the sacrificial layer pattern by partially etching the auxiliary guide layer of the aperture area in a state where the second photoresist layer is maintained.

In one embodiment, the method includes maintaining the auxiliary guide pattern in the aperture area by removing the sacrificial layer pattern from the aperture area.

According to another embodiment of the present invention, there is provided a method of fabricating a polarizer, the method including forming a base substrate by sequentially forming a metal layer, a guide layer, a hard mask layer, a sacrificial layer, and a first photoresist layer on a light-transmitting substrate in a panel area and an alignment key area spatially separated from the panel area, forming a first photoresist layer pattern for forming an alignment key pattern in the alignment key area by patterning the first photoresist layer, forming a sacrificial layer pattern in the alignment key area utilizing the first photoresist layer pattern as a mask, and forming a second photoresist layer on an auxiliary guide layer in an area which does not overlap the sacrificial layer pattern of the alignment key area before removing the sacrificial layer of an aperture area of the panel area.

According to another embodiment of the present invention, there is provided a polarizer having a structure in which metal layer patterns and capping layer patterns are sequentially stacked on a light-transmitting substrate, wherein an aperture area includes first metal layer patterns which are shaped like line structures separated from each other to partially expose the light-transmitting substrate and first capping layer patterns which are respectively formed on the first metal layer patterns, and a non-aperture area includes a second metal layer pattern which covers the entire surface of the light-transmitting substrate in the non-aperture area, and a second capping layer pattern which is formed on the second metal layer pattern.

In one embodiment, the aperture area further includes first guide patterns which are respectively formed on the first capping layer patterns, and the non-aperture area includes a second guide pattern which covers the second capping layer pattern.

In one embodiment, the aperture area further includes first hard mask patterns which are respectively formed on the first guide patterns, and the non-aperture area further includes second hard mask patterns which are formed on the second guide pattern and shaped like line structures arranged at regular intervals to partially expose the second guide pattern.

In one embodiment, the non-aperture area further includes capping layer patterns which are respectively formed on the second hard mask patterns.

BRIEF DESCRIPTION OF THE DRAWINGS

The above and other aspects and features of the present invention will become more apparent by describing in detail exemplary embodiments thereof with reference to the attached drawings, in which:

FIG. 1 is a cross-sectional view schematically illustrating an operation of forming a base substrate used to fabricate a polarizer and an operation of forming a first photoresist layer according to a first embodiment of the present invention;

FIG. 2 is a cross-sectional view schematically illustrating an operation of forming sacrificial layer patterns and an operation of forming an auxiliary guide layer after the operation of FIG. 1;

DETAILED DESCRIPTION

Figure 3:
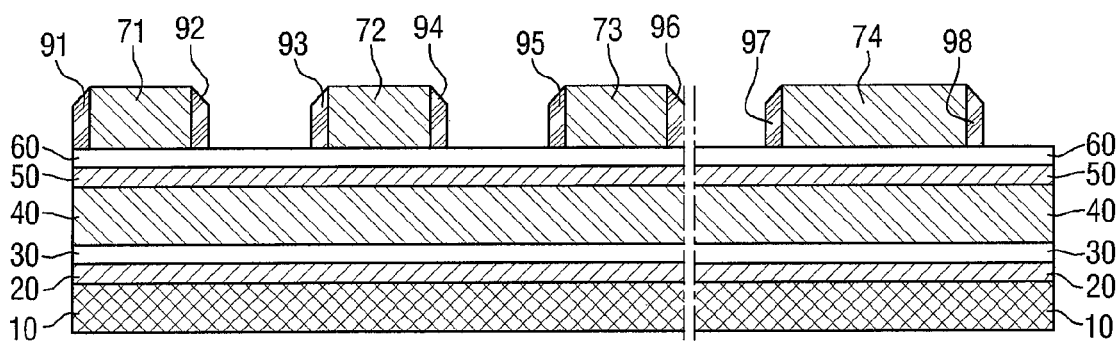
FIG. 3 is a cross-sectional view schematically illustrating an operation of forming auxiliary guide patterns after the operations of FIG. 2.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of "may" when describing embodiments of the inventive concept refers to "one or more embodiments of present invention". The term "exemplary" is intended to refer to an example or illustration. As used herein, the terms "use," "using," and "used" may be considered synonymous with the terms "utilize," "utilizing," and "utilized," respectively.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, embodiments of the present invention will be described with reference to the accompanying drawings.

FIG. 1 is a cross-sectional view schematically illustrating an operation of forming a base substrate used to fabricate a polarizer and an operation of forming a first photoresist layer according to a first embodiment of the present invention.

To polarize an electromagnetic wave, an array of parallel conducting wires may be used. This array of parallel conducting wires is generally referred to as a wire grid. In one embodiment, the wire grid is formed on a transparent substrate and used as a polarizer in an ultraviolet region, a visible region or an infrared region among wavelengths of the electromagnetic wave according to the interval between line patterns of the wire grid.

A wire grid polarizer is a kind of optical device that induces unpolarized light into linearly polarized light having a specific oscillation direction. The wire grid polarizer may have a structure in which fine metal lines are arranged parallel to each other on a light-transmitting substrate.

If a pitch of the fine metal lines is sufficiently shorter than a wavelength of incident light, a component (i.e., p-polarized light light) of the incident light which has an electric field vector orthogonal to the fine metal lines is transmitted through the wire grid polarizer, whereas a component (i.e., s-polarized light) having an electric field vector parallel to the fine metal lines is reflected. The wire grid polarizer can increase light efficiency by recycling the s-polarized light.

In addition, to maximize light efficiency, the wire grid polarizer has the fine metal lines arranged parallel to each other only in an aperture area of a liquid crystal display panel and has a reflective plate formed in a non-aperture area of the liquid crystal display panel.

The polarizer according to the first embodiment may be a wire grid polarizer.

Referring to FIG. 1, the operation of forming the base substrate used to fabricate the polarizer and an operation of forming a first photoresist layer according to the first embodiment may include preparing a light-transmitting substrate 10, forming a metal layer 20, forming a first capping layer 30, forming a guide layer 40, forming a hard mask layer 50, forming a second capping layer 60, forming a sacrificial layer 70, and forming first photoresist layer patterns 81 through 84.

The base substrate may include an aperture area in which wire grid patterns are formed to transmit light, a non-aperture area which reflects light, and an alignment key area in which an alignment key is formed. The aperture area and the non-aperture area may be determined by a second photoresist layer 100 which will be described later. In the polarizer, the aperture area may act as a polarizing unit, and the non-aperture area may act as a reflecting unit.

The aperture area and the non-aperture area may collectively be defined as a panel area, and the alignment key area may be part of a non-panel area spatially separated from the panel area.

The alignment key is used to align overlayers in a subsequent process to the fabrication of the polarizer. The subsequent process may be a process of forming a protective layer, a thin-film transistor layer, etc. on the polarizer.

In one embodiment, the light-transmitting substrate 10 serves as a baseplate on which the metal layer 20, the first capping layer 30, the guide layer 40, the hard mask layer 50, the second capping layer 60, the sacrificial layer 70, and a first photoresist layer (81 through 84) are to be formed. The preparing of the light-transmitting substrate 10 is to prepare the light-transmitting substrate 10 as a baseplate.

The light-transmitting substrate 10 may include a material having superior light-transmitting, heat-resistant, and chemically resistant properties. For example, the light-transmitting substrate 10 may include any one of glass, polyethylene naphthalate, polyethylene terephthalate, and polyacryl having superior light-transmitting properties. For example, the light-transmitting substrate 10 may be glass.

The forming of the metal layer 20 is to form the metal layer 20 on the light-transmitting substrate 10. The metal layer 20 may be made of aluminum (Al), gold (Au), silver (Ag), copper (Cu), etc. For example, the metal layer 20 may be made of aluminum having high reflectivity.

The forming of the first capping layer 30 is to form the first capping layer 30 on the metal layer 20. The first capping layer 30 can prevent (or protect from) a hillock phenomenon of the metal layer 20. The first capping layer 30 may act as a hard mask used to form the wire grid patterns in the aperture area.

The first capping layer 30 may be made of a material having a lower etch rate than the metal layer 20. For example, the first capping layer 30 may be made of titanium (Ti). The first capping layer 30 can be omitted. However, forming the first capping layer 30 on the metal layer 20 may prevent the hillock phenomenon of the metal layer 20.

The forming of the guide layer 40 is to form the guide layer 40 on the first capping layer 30. The guide layer 40 may be made of a material having a higher etch rate than the material of the first capping layer 30. For example, the guide layer 40 may be made of silicon nitride (SiNx).

The forming of the hard mask layer 50 is to form the hard mask layer 50 on the guide layer 40. The hard mask layer 50 may be made of a material having a lower etch rate than the material that forms the guide layer 40. For example, the hard mask layer 50 may be aluminum.

The forming of the second capping layer 60 is to form the second capping layer 60 on the hard mask layer 50. The second capping layer 60 can prevent the hillock phenomenon of the hard mask layer 50. The material of the second capping layer 60 may have a lower etch rate than the material of the hard mask layer 50. For example, the second capping layer 60 may be made of titanium (Ti). The second capping layer 60 can be omitted. However, forming the second capping layer 60 on the hard mask layer 50 may prevent the hillock phenomenon of the hard mask layer 50.

The forming of the sacrificial layer 70 is to form the sacrificial layer 70 on the second capping layer 60. The material of the sacrificial layer 70 may have a higher etch rate than the material of the hard mask layer 50 and the material of the second capping layer 60. For example, the sacrificial layer 70 may be made of silicon nitride (SiNx).

The forming of the first photoresist layer patterns 81 through 84 may include coating a first photoresist film material on the sacrificial layer 70 and patterning the coated first photoresist film material using photolithography such that the sacrificial layer 70 is partially exposed at regular intervals in the aperture area, the non-aperture area, and the alignment key area.

The first photoresist layer patterns 81 through 84 may include the first photoresist layer patterns 81 and 82 of the aperture area, the first photoresist layer pattern 83 of the non-aperture area, and the first photoresist layer pattern 84 of the alignment key area.

In the drawing, two first photoresist layer patterns 81 and 82 are formed in the aperture area. However, the present invention is not limited thereto, and the first photoresist layer patterns 81 and 82 may be some of a plurality of first photoresist layer patterns of the aperture area.

The first photoresist layer pattern 82 of the aperture area may be located at a boundary between the aperture area and the non-aperture area. The first photoresist layer pattern 81 is formed on an inner side of the aperture area based on the first photoresist layer pattern 82, and the first photoresist layer pattern 83 is formed on an outer side of the aperture area based on the first photoresist layer pattern 82.

The first photoresist layer pattern 83 may be one of first photoresist layer patterns of the non-aperture area. The first photoresist layer pattern 83 may be separated from the first photoresist layer pattern 82 of the aperture area by a distance (e.g., a predetermined distance). Here, the sacrificial layer 70 may be exposed between the first photoresist layer pattern 82 and the first photoresist layer pattern 83.

The first photoresist layer pattern 84 of the alignment key area may be formed to partially expose the sacrificial layer 70 of the alignment key area. For example, the first photoresist layer pattern 84 may be formed to expose the sacrificial layer 70 on left and right sides of the first photoresist layer pattern 84 as illustrated in FIG. 1.

The first photoresist layer patterns 81 through 84 may serve as a mask used to form sacrificial layer patterns 71 through 74 (see FIG. 2) which will be described later. The first photoresist layer pattern 84 may determine a first alignment key pattern area.

FIG. 2 is a cross-sectional view schematically illustrating an operation of forming the sacrificial layer patterns 71 through 74 and an operation of forming an auxiliary guide layer 90 after the operation of FIG. 1.

The operation of forming the sacrificial layer patterns 71 through 74 is to pattern the sacrificial layer 70 by partially removing the sacrificial layer 70 in an etching process using the first photoresist layer patterns 81 through 84 (see FIG. 1) as a mask.

The sacrificial layer patterns 71 through 74 may be arranged at regular intervals to partially expose the second capping layer 60 and may be located at positions overlapping the positions of the first photoresist layer patterns 81 through 84 (see FIG. 1).

The second capping layer 60 may be exposed on the left and right sides of the sacrificial layer pattern 74 of the alignment key area. The sacrificial layer pattern 74 of the alignment key area is protected by the second photoresist layer 100 and thus maintained intact in an operation of removing sacrificial layer patterns and an operation of forming guide patterns. Therefore, the sacrificial layer pattern 74 can serve as a first alignment key pattern.

The operation of forming the sacrificial layer patterns 71 through 74 may include removing the first photoresist layer patterns 81 through 84. The removing of the first photoresist layer patterns 81 through 84 is to remove the first photoresist layer patterns 81 through 84 formed on the sacrificial layer patterns 71 through 74.

The operation of forming the auxiliary guide layer 90 is to form the auxiliary guide layer 90 on the sacrificial layer patterns 71 through 74. Part of the auxiliary guide layer 90 may form auxiliary guide patterns 91 through 98. The auxiliary guide layer 90 may be formed on top and side surfaces of the sacrificial layer patterns 71 through 74 and a top surface of the second capping layer 60 to entirely cover the sacrificial layer patterns 71 through 74 and the second capping layer 60 exposed between the sacrificial layer patterns 71 through 74.

FIG. 3 is a cross-sectional view schematically illustrating an operation of forming the auxiliary guide patterns 91 through 98 after the operations of FIG. 2.

The auxiliary guide patterns 91 through 98 are barrier ribs formed on the side surfaces of the sacrificial layer patterns 71 through 74. The sacrificial layer pattern 71 may be interposed between the auxiliary guide patterns 91 and 92, the sacrificial layer pattern 72 may be interposed between the auxiliary guide patterns 93 and 94, the sacrificial layer pattern 73 may be interposed between the auxiliary guide patterns 95 and 96, and the sacrificial layer pattern 74 may be interposed between the auxiliary guide patterns 97 and 98.

The second capping layer 60 may be exposed between the auxiliary guide patterns 92 through 97. In addition, the second capping layer 60 on the right side of the auxiliary guide pattern 98 in the alignment key area may be exposed as illustrated in FIG. 3.

The auxiliary guide patterns 91 through 98 may be formed by removing the auxiliary guide layer 90, which covers the top surfaces of the sacrificial layer patterns 71 through 74 and the top surface of the second capping layer 60 exposed between the sacrificial layer patterns 71 through 74, using an etching process.

The auxiliary guide patterns 91 through 98 are also referred to as spacer patterns.

Figure 4:
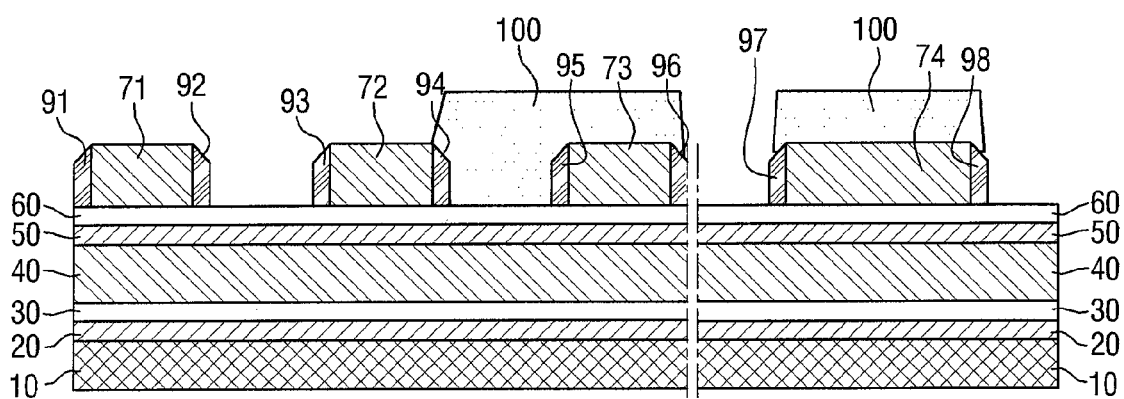
FIG. 4 is a cross-sectional view schematically illustrating an operation of forming a second photoresist layer after the operation of FIG. 3.

FIG. 4 is a cross-sectional view schematically illustrating an operation of forming the second photoresist layer 100 after the operation of FIG. 3.

A modified base plate or resulting product after the operation of FIG. 3 may be disposed in an exposure device. Disposing the modified base plate in the exposure device is made using the sacrificial pattern 74. The second photoresist layer 100 may be aligned with at least one of the sacrificial patterns 71 through 74 of the modified base plate using the sacrificial pattern 74. The second photoresist layer 100 may be formed only in the non-aperture area and the alignment key area.

The second photoresist layer 100 may entirely cover the non-aperture area. The second photoresist layer 100 may be formed to entirely cover the top surface of the second capping layer 60 and the side and top surfaces of the sacrificial layer pattern 73 in the non-aperture area. In the non-aperture area, the top surface of the second capping layer 60 and the top surface of the sacrificial layer pattern 73 may not be exposed. The second photoresist layer 100 may cover the auxiliary guide patterns 94 through 96. Therefore, in the subsequent operation of forming the guide patterns, the auxiliary guide patterns 94 through 96 may be maintained without being removed.

The second photoresist layer 100 of the alignment key area may be formed to cover the sacrificial layer pattern 74 and top surfaces of the auxiliary guide patterns 97 and 98 formed on the side surfaces of the sacrificial layer pattern 74. However, the present invention is not limited thereto, and the second photoresist layer 100 may also be formed to entirely cover the alignment key area.

The second photoresist layer 100 may protect the sacrificial layer pattern 74 in the operation of removing the sacrificial layer patterns and the operation of forming the guide patterns. If not protected by the second photoresist layer 100, the sacrificial layer pattern 74 of the alignment key area may be removed together with the sacrificial layer patterns 71 and 72 in the operation of removing the sacrificial layer patterns 71 and 72. In this case, only the auxiliary guide patterns 97 and 98, which may have a fine line width of nanometers may remain in the alignment key area. Accordingly, this may cause an alignment key recognition defect or error in a subsequent process.

However, since the second photoresist layer 100 protects the sacrificial layer pattern 74, which may have a line width of tens of micrometers, the fabrication method according to the first embodiment may prevent the alignment key recognition defect or error.

Figure 5:
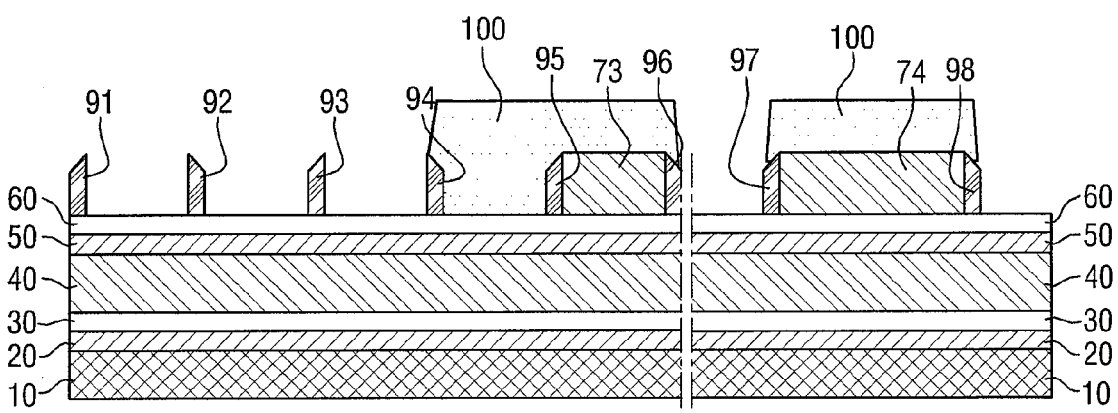
FIG. 5 is a cross-sectional view schematically illustrating an operation of removing the sacrificial layer patterns after the operation of FIG. 4.

FIG. 5 is a cross-sectional view schematically illustrating the operation of removing the sacrificial layer patterns 71 and 72 after the operation of FIG. 4.

Referring to FIG. 5, only the sacrificial layer patterns 71 and 72 of the aperture area not protected by the second photoresist layer 100 may be removed. After the removal of the sacrificial layer patterns 71 and 72, only the auxiliary guide patterns 91 through 93 may remain on the second capping layer 60 of the aperture area.

The auxiliary guide patterns 91 through 93 are shaped like line structures having a fine linewidth of 100 to 300 nanometers (nm) and arranged at regular intervals. Therefore, the second capping layer 60 of the aperture area may be exposed between the line structures.

Figure 6:
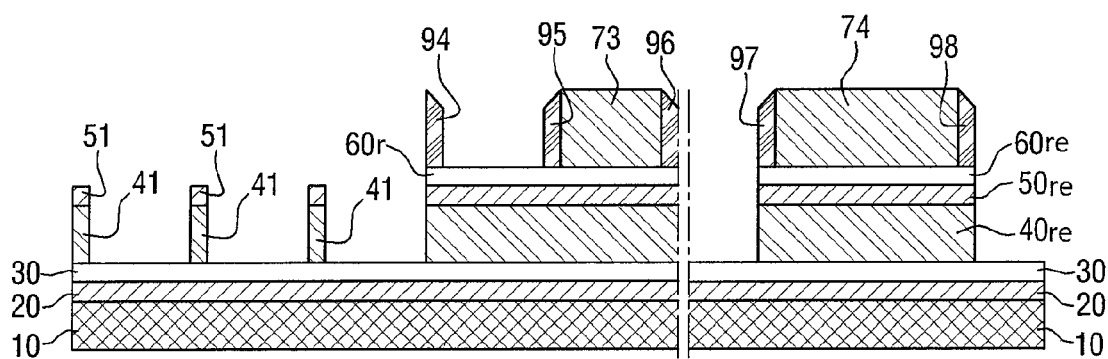
FIG. 6 is a cross-sectional view schematically illustrating an operation of forming guide patterns after the operation of FIG. 5.

FIG. 6 is a cross-sectional view schematically illustrating the operation of forming the guide pattern 41 after the operation of FIG. 5.

Referring to FIGS. 5 and 6 together, the operation of forming the guide patterns 41 may be performed in a state where the second photoresist layer 100 is maintained intact in the non-aperture area and the alignment key area.

Therefore, in the aperture area only, the second capping layer 60, the hard mask layer 50 and the guide layer 40 may be sequentially removed using the auxiliary guide patterns 91 through 93 as a mask. As a result, hard mask layer patterns 51 and the guide patterns 41 may be formed in the aperture area.

Although not illustrated in the drawings, when the second capping layer 60 of the aperture area is removed using the auxiliary guide patterns 91 through 93 as a mask, second capping layer patterns (not illustrated) may be formed on the hard mask layer 50.

The hard mask layer patterns 51 may be formed on the guide layer 40 by etching the hard mask layer 50 using the second capping layer patterns (not illustrated) as a mask, and the guide patterns 41 may be formed on the first capping layer 30 by etching the guide layer 40 using the hard mask layer patterns 51 as a mask.

The second capping layer patterns (not illustrated) may be formed under the auxiliary guide patterns 91 through 93 at positions overlapping the positions of the auxiliary guide patterns 91 through 93. The hard mask layer patterns 51 may be formed under the second capping layer patterns (not illustrated) at positions overlapping the positions of the second capping layer patterns. The guide patterns 41 may be formed under the hard mask layer patterns 51 at positions overlapping the positions of the hard mask layer patterns 51.

In the above description, the auxiliary guide patterns 91 through 93, the second capping layer patterns (not illustrated), the hard mask layer patterns 51, and the guide patterns 41 are formed sequentially. However, when the hard mask layer patterns 51 are formed, some of the auxiliary guide patterns 91 through 93 may not be completely removed but may be maintained depending on the thickness, etch rate, etc. of each of the second capping layer 60, the hard mask layer 50 and the guide layer 40. In addition, when the guide patterns 41 are formed, the second capping layer patterns (not illustrated) may be maintained without being completely removed.

After the formation of the guide patterns 41, the second photoresist layer 100 may be removed from the non-aperture area and the alignment key area.

The auxiliary guide patterns 94 through 96 and the sacrificial layer pattern 73 between the auxiliary guide pattern 95 and 96 may remain on the second capping layer 60 (indicated by reference character 60r) of the non-aperture area without the second photoresist layer 100.

The auxiliary guide patterns 94 through 96 may be shaped like line structures having a fine line width and arranged at regular intervals, and the sacrificial layer pattern 73 may be interposed between the linear structures. The second capping layer 60r may be exposed between the auxiliary guide patterns 94 and 95.

In the alignment key area, the sacrificial layer pattern 74, the auxiliary guide layer patterns 97 and 98, the second capping layer 60 (indicated by reference character 60re), the hard mask layer 50 (indicated by reference character 50re), and the guide layer 40 (indicated by reference character 40re) in a region protected by the second photoresist layer 100 are maintained intact, whereas the sacrificial layer 70, the second capping layer 60, the hard mask layer 50 and the guide layer 40 in a region not protected by the second photoresist layer 100 are removed by etching.

Figure 7:
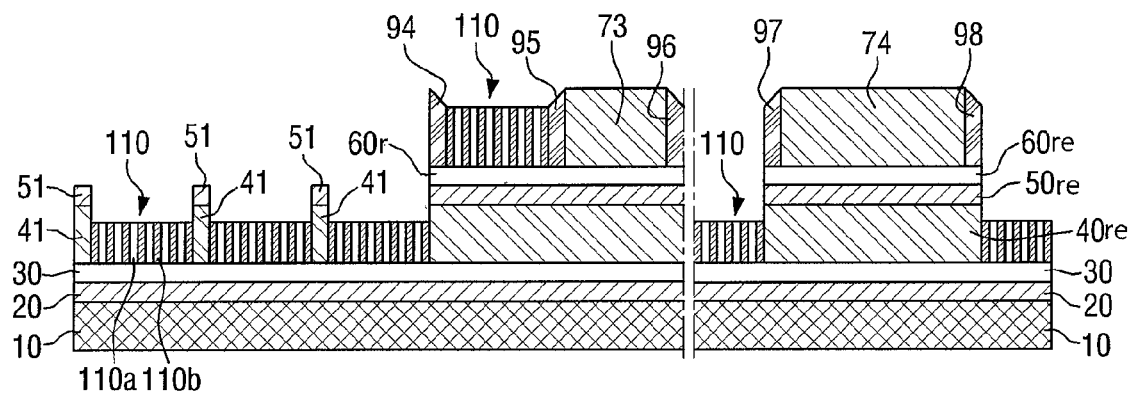
FIG. 7 is a cross-sectional view schematically illustrating an operation of coating a block copolymer and an operation of self-assembling the block copolymer after the operation of FIG. 6.

FIG. 7 is a cross-sectional view schematically illustrating an operation of coating a block copolymer 110 and an operation of heat-treating or solvent-annealing the block copolymer 110 after the operation of FIG. 6.

The block copolymer 110 may be coated on both the panel area and the alignment key area. The block copolymer 110 may be heat-treated or solvent-annealed to produce first blocks 110a and second blocks 110b arranged alternately along a lateral direction.

In the aperture area, the block copolymer 110 may be coated on the first capping layer 30 between the guide patterns 41. In the non-aperture area, the block copolymer 110 may be coated on the second capping layer 60r between the auxiliary guide patterns 94 and 95. In the alignment key area, the block copolymer 110 may be coated on the exposed first capping layer 30.

The block copolymer 110 may include poly(styrene-b-methylmethacrylate) (PS-b-PMMA), poly(styrene-b-butadiene) (PS-b-PB), poly(styrene-b-isoprene) (PS-b-PI), poly(styrene-b-ethylene) (PS-b-PE), poly(styrene-b-ethyleneoxide) (PS-b-PEO), poly(styrene-b-ferrocenyldimethylsilane) (PS-b-PFS), poly(styrene-b-(2-vinylpyridine)) (PS-b-P2VP), and/or poly(styrene-b-dimethylsiloxane) (PS-b-PDMS). In addition, the block copolymer 110 may have a molecular weight of 10,000 to 300,000.

For example, PS-b-PMMA is a covalent bond of a PS block and a PMMA block. Both the PS block and the PMMA block may have a molecular weight of 52,000 kg/mol and a period of 48 nm. The kind and molecular weight of the block copolymer 110 are not limited to the above example.

The block copolymer 110 may be self-assembled by heat treatment or solvent annealing to produce the first blocks 110a and the second blocks 110b arranged alternately. The heat-treatment condition for the self-assembly of the block copolymer 110 is set to a temperature range of a glass transition temperature that causes the block copolymer 110 to have fluidity to a temperature that does not pyrolyze the block copolymer 110.

For example, PS-b-PMMA can be self-assembled at a temperature of approximately (about) 100° C. or above. However, it takes a long time for PS-b-PMMA to be completely self-assembled at low temperatures. Therefore, PS-b-PMMA may be heat-treated at approximately (about) 250° C. in a high-vacuum (oxygen-free) atmosphere. In this case, since the flow of molecules is active, a regular self-assembly can be completed within a short time.

In solvent annealing for self-assembly, a saturated solvent gas is used to give flexibility and mobility to a polymer chain. Accordingly, a solvent is evaporated from the surface of a thin film, thus causing the thin film to be self-assembled.

Before the self-assembly of the block copolymer 110, the first blocks 110a and the second blocks 110b of the block copolymer 110 are distributed disorderly without forming a particular pattern. However, as the block copolymer 110 is self-assembled, molecules flow to form a particular pattern.

The first blocks 110a and the second blocks 110b of the block copolymer 110 may be arranged alternately while remaining parallel to the guide patterns 41.

Figure 8:
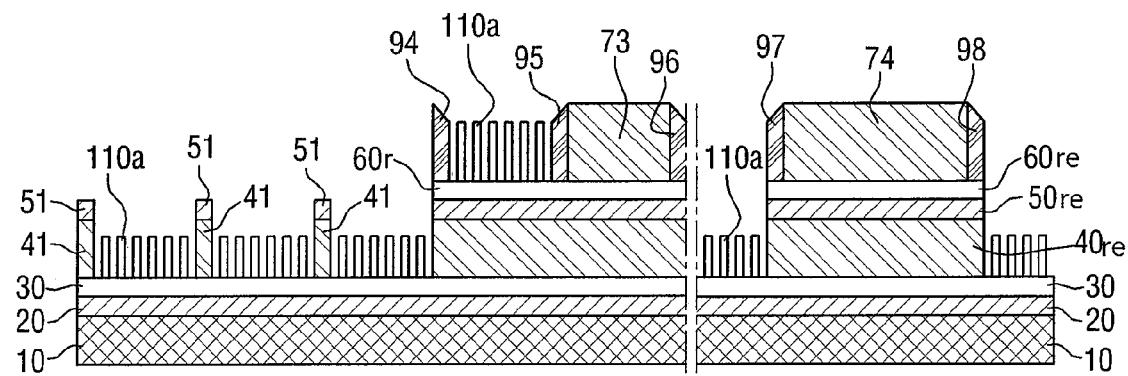
FIG. 8 is a cross-sectional view schematically illustrating an operation of forming self-assembly patterns after the operations of FIG. 7.

FIG. 8 is a cross-sectional view schematically illustrating an operation of forming self-assembly patterns by removing the first blocks 110a or the second blocks 110b after the operations of FIG. 7.

In an example, the second blocks 110b among the first blocks 110a and the second blocks 110b may be removed. The first blocks 110a or the second blocks 110b may be removed by wet etching or dry etching.

For example, if the block copolymer 110 is PS-b-PMMA, it may be wet-etched using an acetic acid solution after ultraviolet-ozone treatment (UVO). Alternatively, only the second blocks 110b may be removed using oxygen plasma etching which is dry etching. For example, the second blocks 110b may be PMMA.

In the aperture area, the first blocks 110a may be formed on the first capping layer 30 between the guide patterns 41. In the non-aperture area, the first blocks 110a may be formed on the second capping layer 60r between the auxiliary guide patterns 94 and 95. In the alignment key area, the first blocks 110a may be formed on the exposed first capping layer 30.

Figure 9:
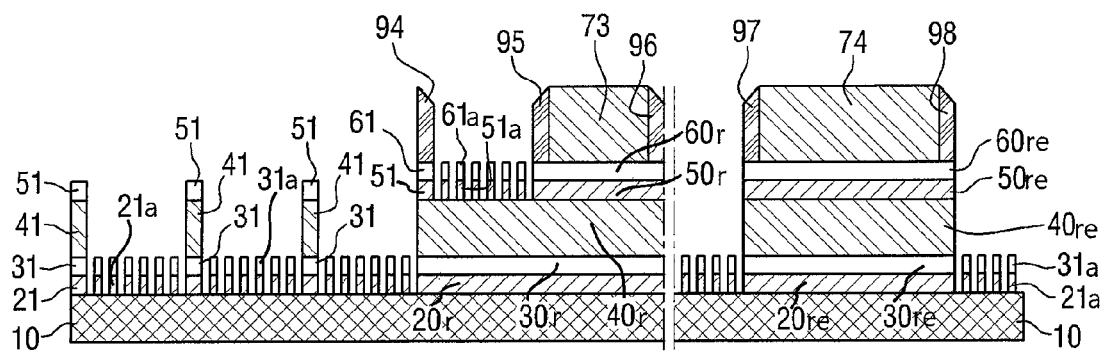
FIG. 9 is a cross-sectional view schematically illustrating an operation of forming first capping layer patterns and an operation of forming metal layer patterns after the operation of FIG. 8.

FIG. 9 is a cross-sectional view schematically illustrating an operation of forming first capping layer patterns 31a and metal layer patterns 21a in the aperture area using the first blocks 110a as a mask and an operation of forming first capping layer patterns 31 and metal layer patterns 21 in the aperture area using the hard mask patterns 51 and the guide patterns 41 as a mask.

The first capping layer patterns 31a and the metal layer patterns 21a may be formed under the first blocks 110a at positions overlapping the positions of the first blocks 110a. The first capping layer patterns 31 and the metal layer patterns 21 may be formed under the hard mask patterns 51 and the guide patterns 41 at positions overlapping the positions of the hard mask patterns 51 and the guide patterns 41.

The first capping layer patterns 31a may be formed between the first capping layer patterns 31, and the metal layer patterns 21a may be formed between the metal layer patterns 21. The light-transmitting substrate 10 may be regularly exposed between the hard mask patterns 51 and 51a, the guide patterns 41, the first capping layer patterns 31 and 31a, and the metal layer patterns 21 and 21a.

In the non-aperture area, a guide pattern 40r entirely covers the light-transmitting substrate 10, a metal layer pattern 20r, and a first capping layer pattern 30r. Therefore, the light-transmitting substrate 10, the metal layer pattern 20r, and the first capping layer pattern 30r are not exposed.

The metal layer pattern 20r, the first capping layer pattern 30r and the guide pattern 40r are the metal layer 20, the first capping layer 30 and the guide layer 40 of the non-aperture area which have not been patterned, that is, do not have trenches.

The hard mask patterns 51, 51a and 50r may be formed on the guide pattern 40r. The hard mask patterns 51a may be patterned using the first blocks 110a as a mask, and the hard mask pattern 51 may be patterned using the auxiliary guide pattern 94 as a mask.

A first region of the guide pattern 40r may be regularly exposed between the hard mask patterns 51 and 51a. The hard mask patterns 51a may be disposed between the hard mask pattern 51 and the hard mask pattern 50r.

Since the hard mask pattern 50r is protected by the auxiliary guide patterns 95 and 96 and the sacrificial layer pattern 73, it is not patterned, unlike the hard mask patterns 51 and 51a. Therefore, a second region of the guide pattern 40r is covered with the hard mask pattern 50r and not exposed.

Second capping layer patterns 61 and 61a may be formed on the hard mask patterns 51 and 51a, and a second capping layer pattern 60r may be formed on the hard mask pattern 50r. The second capping layer pattern 61 may be formed using the auxiliary guide pattern 94 as a mask, and the second capping layer patterns 61a may be formed using the first blocks 110a as a mask.

Since the second capping layer pattern 60r is protected by the auxiliary guide patterns 95 and 96 and the sacrificial layer pattern 73, it is not patterned, unlike the second capping layer patterns 61 and 61a. Therefore, the hard mask pattern 50r is covered with the second capping layer pattern 60r and not exposed.

The auxiliary guide pattern 94 may be formed on the second capping layer pattern 61, and the auxiliary guide patterns 95 and 96 and the sacrificial layer pattern 73 may be formed on the second capping layer pattern 60r. The sacrificial layer pattern 73 may be disposed between the auxiliary guide patterns 95 and 96. The first region of the guide pattern 40r may be exposed between the auxiliary guide patterns 94 and 95. The second region of the guide pattern 40r may be protected by the auxiliary guide patterns 95 and 96 and the sacrificial layer pattern 73 and thus may not be exposed.

In the alignment key area, the metal layer patterns 21a and 20re may be formed on the light-transmitting substrate 10. The metal layer pattern 20re may be formed between the metal layer patterns 21a which are formed using the first blocks 110a as a mask. In addition, the metal layer pattern 20re may be the remaining metal layer of the alignment key area which has not been patterned, that is, does not have trenches.

The first capping layer patterns 31a and 30re may be formed on the metal layer patterns 21a and 20re. The first capping layer pattern 30re may be formed between the first capping layer patterns 31a which are formed using the first blocks 110a as a mask and may be the remaining first capping layer of the alignment key area which has not been patterned.

A guide pattern 40re, a hard mask pattern 50re, a second capping layer pattern 60re, the sacrificial layer pattern 74 and the auxiliary guide patterns 97 and 98 may be sequentially formed on the first capping layer pattern 30re. The sacrificial layer pattern 74 may be disposed between the auxiliary guide patterns 97 and 98.

Figure 10:
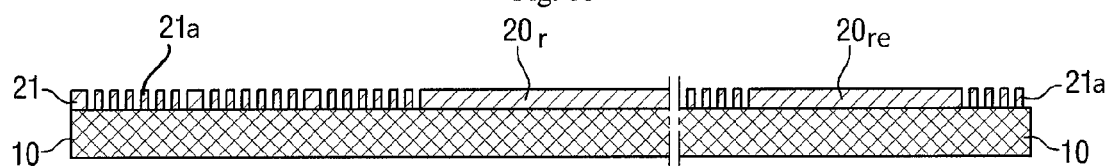
FIG. 10 is a cross-sectional view schematically illustrating an operation of leaving only the metal layer patterns formed on a light-transmitting substrate while removing overlayers of the metal layer patterns after the operations of FIG. 9.

FIG. 10 is a cross-sectional view schematically illustrating an operation of leaving only the metal layer patterns 21, 21a, 20e and 20re on the light-transmitting substrate 10 by removing the first capping layer patterns 31, 31a, 30r and 30re, the guide patterns 41, 41a, 40r and 40re, the hard mask patterns 51, 51a, 50r and 50re, the second capping layer patterns 61, 61a, 60r and 60re, the sacrificial layer patterns 73 and 74, and the auxiliary guide patterns 94 through 98 from the polarizer of FIG. 9.

Referring to FIG. 10, in the aperture area, only the metal layer patterns 21a are disposed between the metal layer patterns 21, and between the metal layer patterns 21 and the metal layer pattern 20r. In the non-aperture area, the metal layer pattern 20r is formed. In the alignment key area, the metal layer pattern 20re is disposed between the metal layer patterns 21a.

Figure 11:
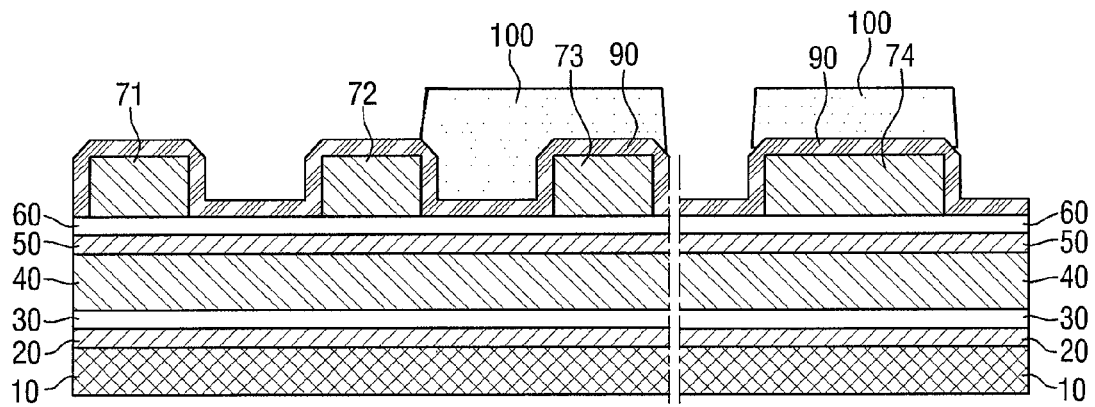
FIG. 11 is a cross-sectional view schematically illustrating an operation of forming a second photoresist layer in a method of fabricating a polarizer according to a second embodiment of the present invention.

FIG. 11 is a cross-sectional view schematically illustrating an operation of forming a photoresist layer in a method of fabricating a polarizer according to a second embodiment of the present invention.

FIG. 11 is different from FIG. 4 in that a second photoresist layer 100 is formed on an auxiliary guide layer 90 before the formation of auxiliary guide patterns 91 through 98.

Referring to FIG. 11, the auxiliary guide layer 90 is formed on sacrificial layer patterns 71 through 74, and then the second photoresist layer 100 is formed on the auxiliary guide layer 90 of a non-aperture area and an alignment key area only.

Therefore, the second photoresist layer 100 is formed on the auxiliary guide layer 90 in a state where top surfaces of the sacrificial layer patterns 71 through 74 are all covered with the auxiliary guide layer 90.

Figure 12:
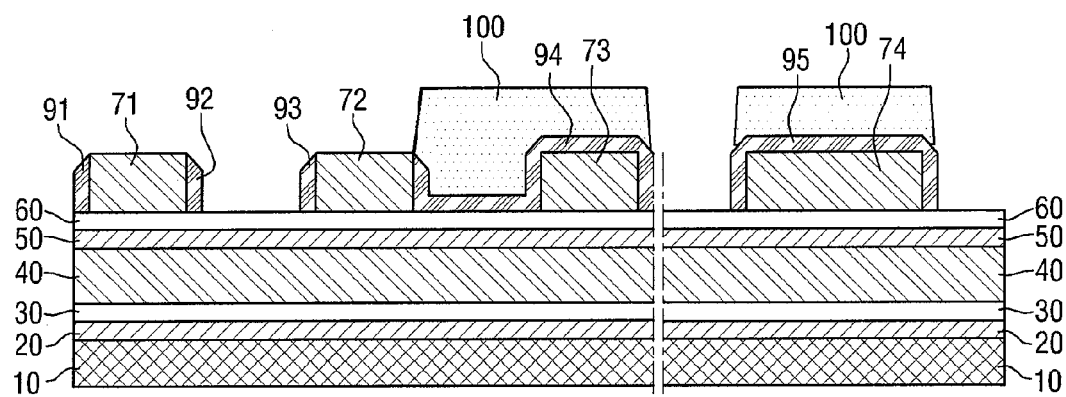
FIG. 12 is a cross-sectional view schematically illustrating an operation of forming auxiliary guide patterns after the operation of FIG. 11.

FIG. 12 is a cross-sectional view schematically illustrating an operation of forming the auxiliary guide patterns 91 through 95.

FIG. 12 is different from FIG. 3 in that the auxiliary guide patterns 94 and 95 cover the top surfaces of sacrificial layer patterns 73 and 74. In addition, FIG. 12 is different from FIG. 3 in that the auxiliary guide pattern 94 is also formed on a second capping layer 60 between the sacrificial layer patterns 72 and 73.

The auxiliary guide patterns 91 through 93 are formed only on side surfaces of the sacrificial layer patterns 71 and 72 of an aperture area, and the second capping layer 60 is exposed between the auxiliary guide patterns 92 and 93.

In the non-aperture area, the second photoresist layer 100 is formed on the auxiliary guide pattern 94, and the auxiliary guide pattern 94 covers the top surface of the sacrificial layer pattern 73 and the second capping layer 60. In the alignment key area, the auxiliary guide pattern 95 may cover all of the top and side surfaces of the sacrificial layer pattern 74.

Figure 13:
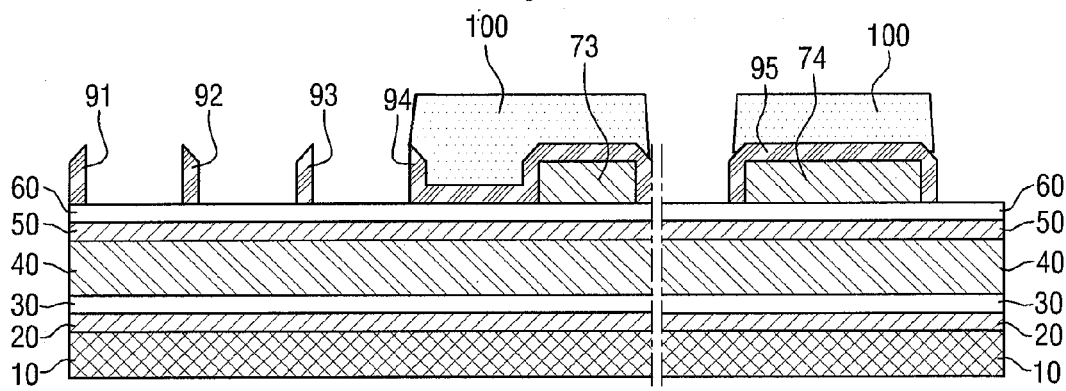
FIG. 13 is a cross-sectional view schematically illustrating an operation of removing sacrificial layer patterns of an aperture area after the operation of FIG. 12.

FIG. 13 is a cross-sectional view schematically illustrating an operation of removing the sacrificial layer patterns 71 and 72.

FIG. 13 is different from FIG. 5 in that the auxiliary guide pattern 94 is formed on the top surface of the sacrificial layer pattern 73 and a top surface of the second capping layer 60 in the non-aperture area.

Figure 14:
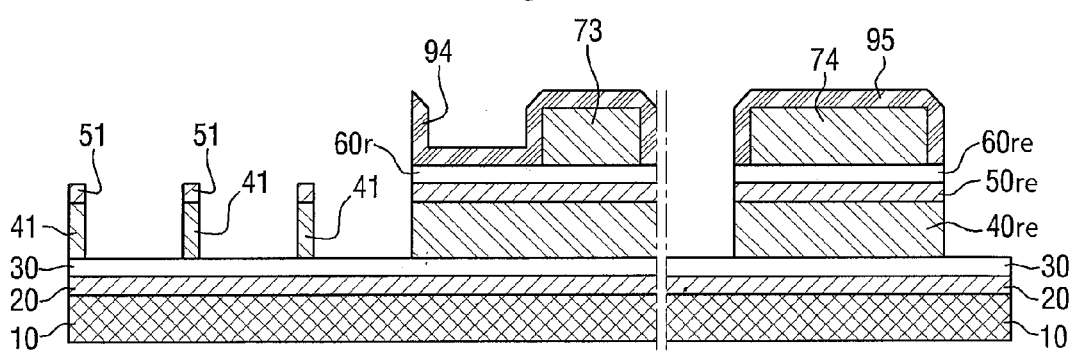
FIG. 14 is a cross-sectional view schematically illustrating an operation of forming guide patterns after the operation of FIG. 13.
Figure 15:
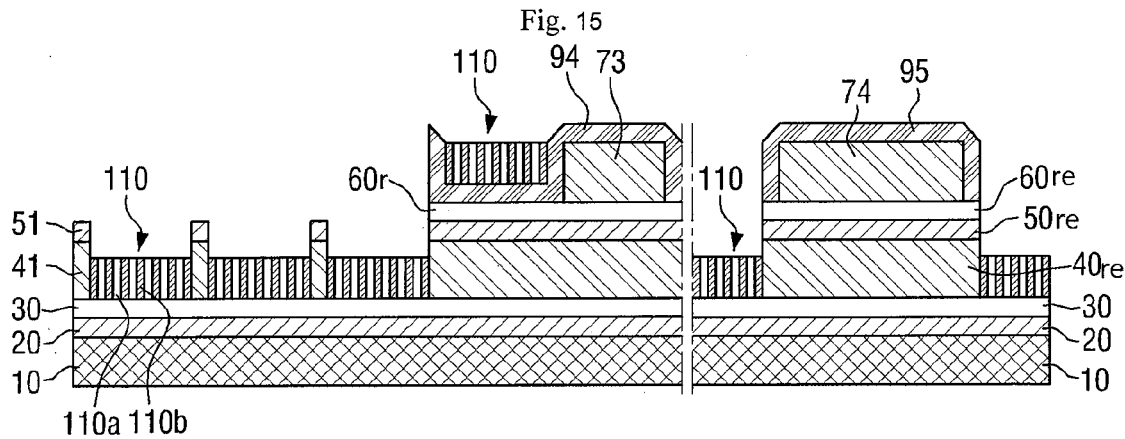
FIG. 15 is a cross-sectional view schematically illustrating an operation of coating a block copolymer and an operation of self-assembling the block copolymer after the operation of FIG. 14.

FIG. 14 is a cross-sectional view schematically illustrating an operation of forming guide patterns 41 in the aperture area. FIG. 15 is a cross-sectional view schematically illustrating an operation of coating a block copolymer 110 and an operation of heat-treating the block copolymer 110.

FIGS. 14 and 15 are different from FIG. 6 in that the auxiliary guide pattern 94 is formed on the top surface of the sacrificial layer pattern 73 and a top surface of a second capping layer pattern 60r and that the auxiliary guide pattern 95 is formed on all of the top and side surfaces of the sacrificial layer pattern 74.

In addition, FIG. 15 is different from FIG. 7 in that the block copolymer 110 is formed on the auxiliary guide pattern 94.

Figure 16:
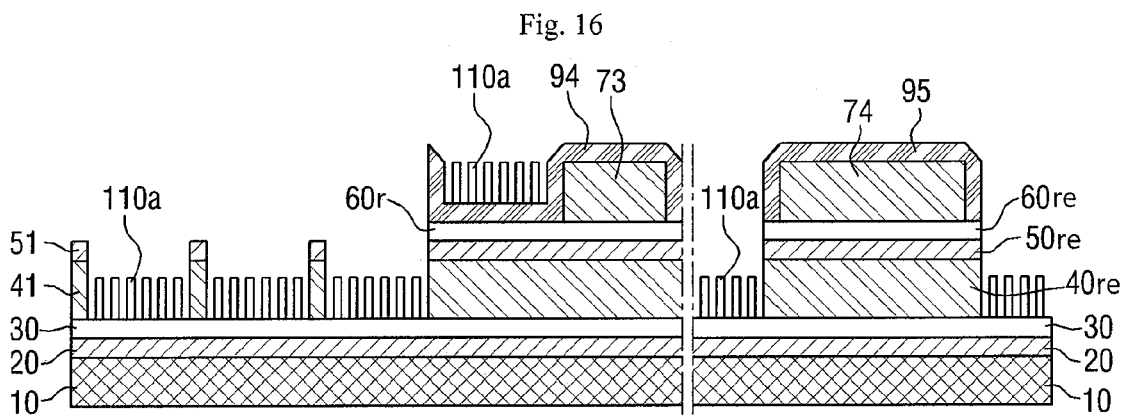
FIG. 16 is a cross-sectional view schematically illustrating an operation of forming self-assembly patterns after the operations of FIG. 15.
Figure 17:
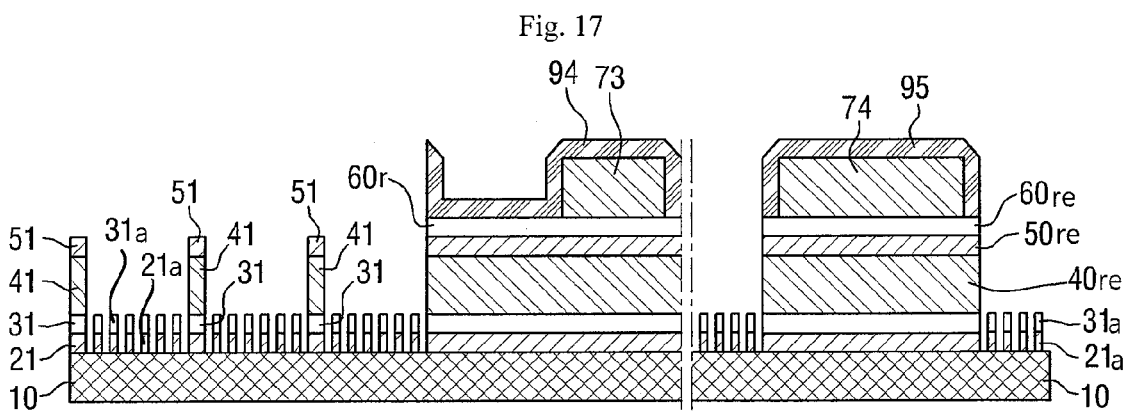
FIG. 17 is a cross-sectional view schematically illustrating an operation of forming first capping layer patterns and an operation of forming metal layer patterns after the operation of FIG. 16.

FIG. 16 is a cross-sectional view schematically illustrating an operation of forming self-assembly patterns 110a after the operation of heat-treating the block copolymer 110. FIG. 17 is a cross-sectional view schematically illustrating an operation of forming first capping layer patterns 31 and 31a and an operation of forming metal layer patterns 21 and 21a after the operation of forming the self-assembly patterns 110a.

FIGS. 16 and 17 are different from FIGS. 8 and 9 in that the auxiliary guide pattern 94 is formed on the top surface of the sacrificial layer pattern 73 and the top surface of the second capping layer pattern 60r and that the auxiliary guide pattern 95 is formed on all of the top and side surfaces of the sacrificial layer pattern 74.

Figure 18:
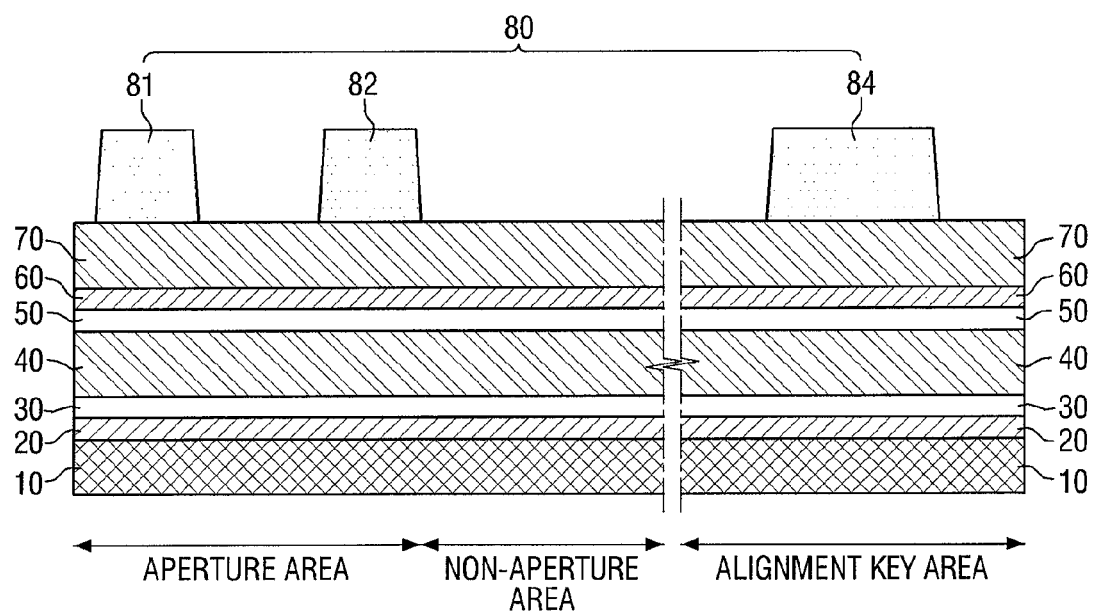
FIG. 18 is a cross-sectional view schematically illustrating an operation of forming a base substrate used to fabricate a polarizer and an operation of forming a first photoresist layer according to a third embodiment of the present invention.

FIG. 18 is a cross-sectional view schematically illustrating an operation of forming a base substrate used to fabricate a polarizer and an operation of forming a first photoresist layer according to a third embodiment of the present invention.

FIG. 18 is different from FIG. 1 in that a first photoresist layer pattern 83 (see FIG. 1) is not formed in a non-aperture area. That is, first photoresist layer patterns 81 and 82 are formed in an aperture area, and a first photoresist layer pattern 84 is formed in an alignment key area. However, the first photoresist layer pattern 83 (see FIG. 1) is not formed in the non-aperture area.

Figure 19:
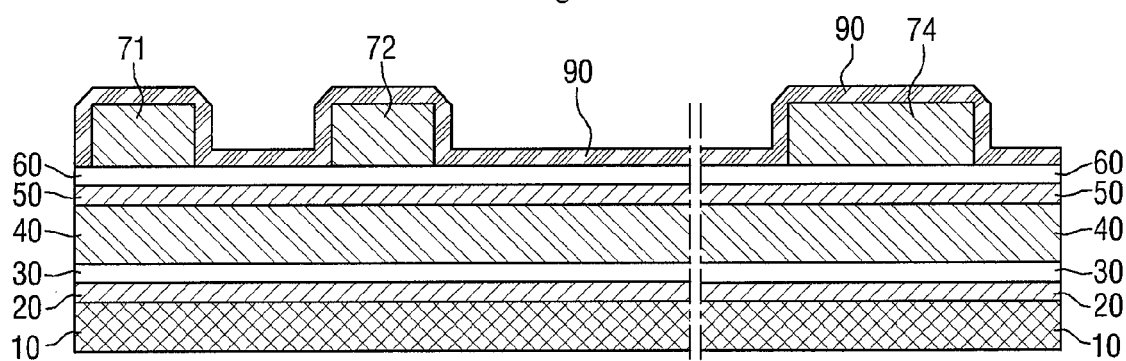
FIG. 19 is a cross-sectional view schematically illustrating an operation of forming sacrificial layer patterns and an operation of forming an auxiliary guide layer after the operation of FIG. 18.

FIG. 19 is a cross-sectional view schematically illustrating an operation of forming sacrificial layer patterns 71 and 72 and an operation of forming an auxiliary guide layer 90 according to the third embodiment.

FIG. 19 is different from FIG. 1 in that a sacrificial layer pattern 73 (see FIG. 2) is not formed in the non-aperture area. That is, the sacrificial layer patterns 71 and 72 are formed in the aperture area, and a sacrificial layer pattern 74 is formed in the alignment key area. However, the sacrificial layer pattern 73 (see FIG. 2) is not formed in the non-aperture area. Therefore, the auxiliary guide layer 90 covers the entire top surface of a second capping layer 60 in the non-aperture area.

Figure 20:
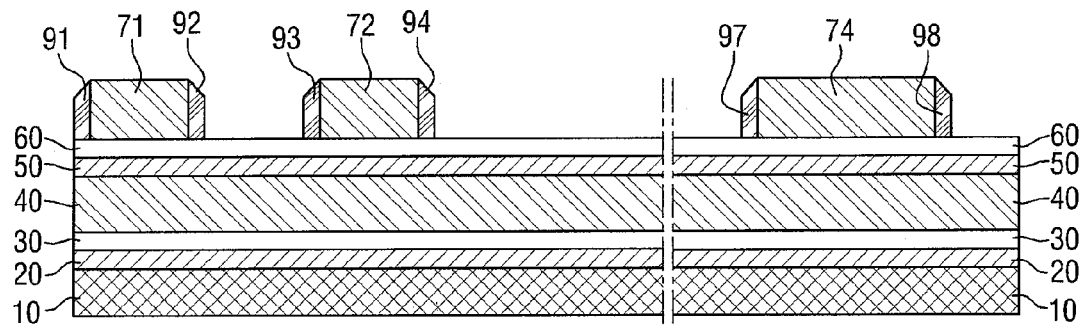
FIG. 20 is a cross-sectional view schematically illustrating an operation of forming auxiliary guide patterns after the operations of FIG. 19.

FIG. 20 is a cross-sectional view schematically illustrating an operation of forming auxiliary guide patterns 91 through 98 according to the third embodiment. FIG. 20 is different from FIG. 3 in that only the auxiliary guide pattern 94 is formed in the non-aperture area.

Figure 21:
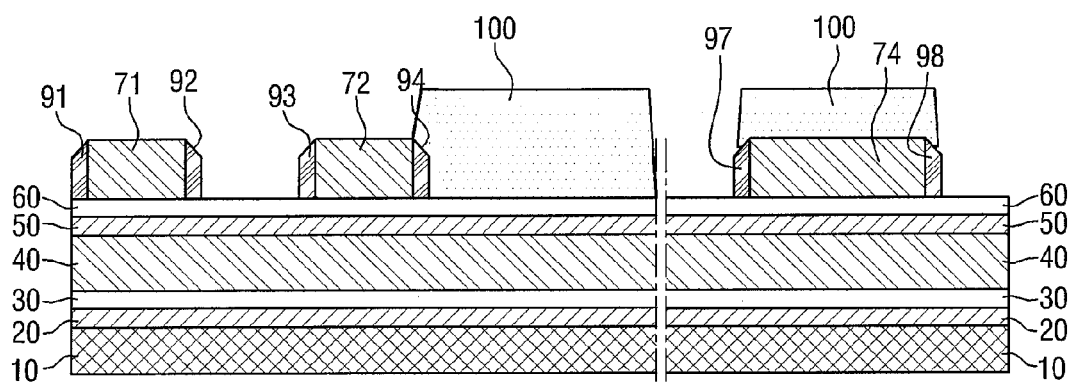
FIG. 21 is a cross-sectional view schematically illustrating an operation of forming a second photoresist layer after the operation of FIG. 20.

FIG. 21 is a cross-sectional view schematically illustrating an operation of forming a second photoresist layer 100 according to the third embodiment. FIG. 21 is different from FIG. 4 in that the second photoresist layer 100 covers the entire top surface of the second capping layer 60 in the non-aperture area.

Figure 22:
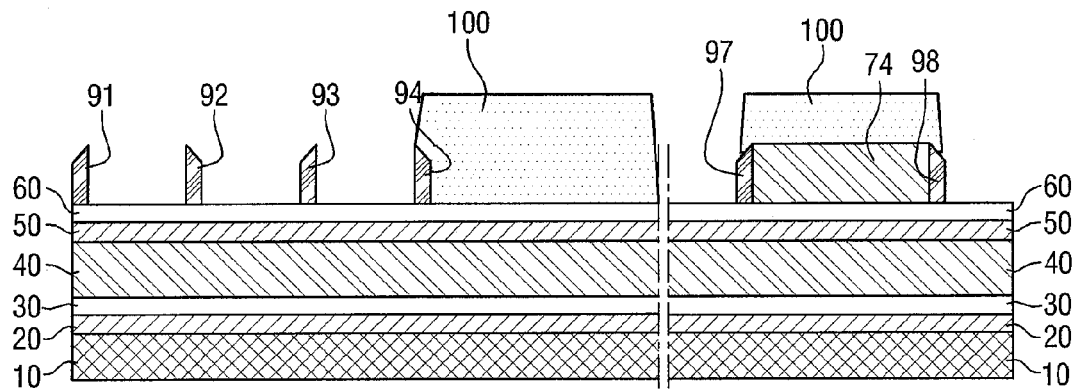
FIG. 22 is a cross-sectional view schematically illustrating an operation of removing the sacrificial layer patterns after the operation of FIG. 21.

FIG. 22 is a cross-sectional view schematically illustrating an operation of removing the sacrificial layer patterns 71 and 72 of the aperture area according to the third embodiment.

FIG. 22 is different from FIG. 5 in that the second photoresist layer 100 covers the entire top surface of the second capping layer 60 of the non-aperture area.

Figure 23:
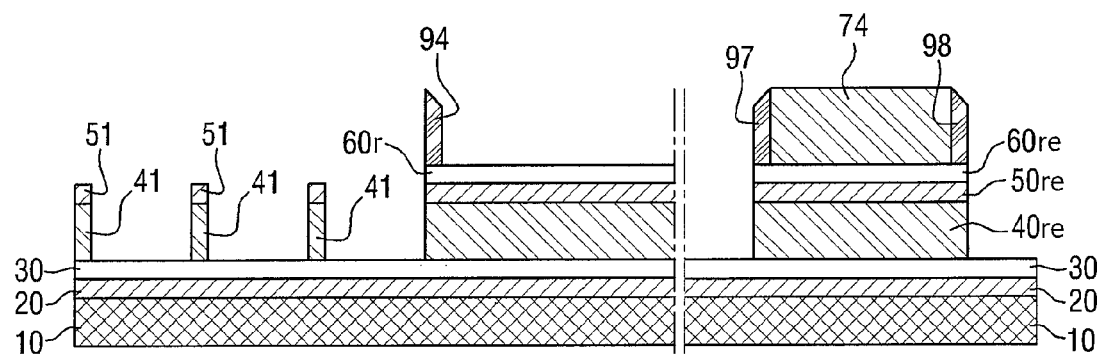
FIG. 23 is a cross-sectional view schematically illustrating an operation of forming guide patterns after the operation of FIG. 22.

FIG. 23 is a cross-sectional view schematically illustrating an operation of forming guide patterns 41 in the aperture area according to the third embodiment. FIG. 23 is different from FIG. 6 in that only the auxiliary guide pattern 94 remains in the non-aperture area after the removal of the second photoresist layer 100.

Figure 24:
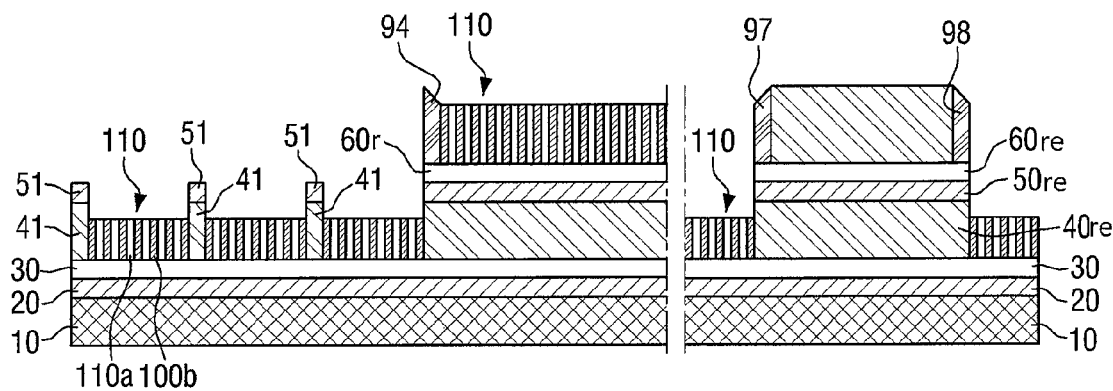
FIG. 24 is a cross-sectional view schematically illustrating an operation of coating a block copolymer and an operation of self-assembling the block copolymer after the operation of FIG. 23.

FIG. 24 is a cross-sectional view schematically illustrating an operation of coating a block copolymer 110 and an operation of self-assembling the block copolymer 110 according to the third embodiment.

FIG. 24 is different from FIG. 7 in that the block copolymer 110 is coated on the entire top surface of the second capping layer 60r of the non-aperture area and self-assembled into first blocks 110a and second blocks 110b arranged alternately.

Figure 25:
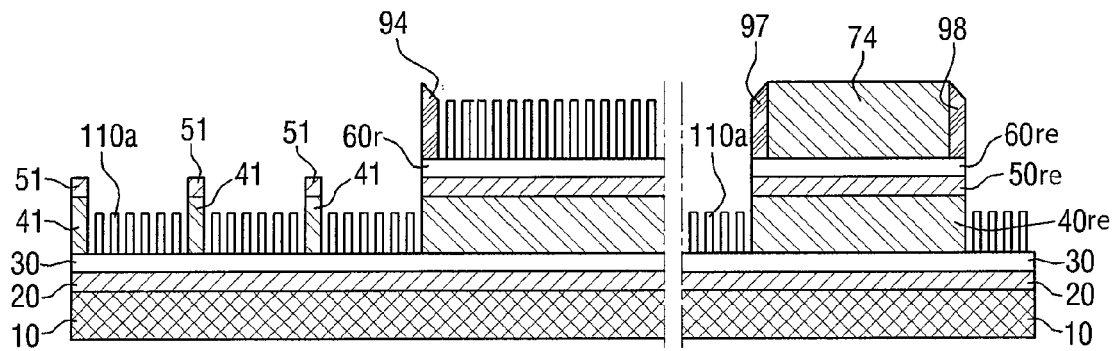
FIG. 25 is a cross-sectional view schematically illustrating an operation of forming self-assembly patterns after the operations of FIG. 24.

FIG. 25 is a cross-sectional view schematically illustrating an operation of forming self-assembly patterns according to the third embodiment. FIG. 25 is different from FIG. 8 in that first blocks 110a are arranged at regular intervals on the entire top surface of the second capping layer 60r of the non-aperture area.

Figure 26:
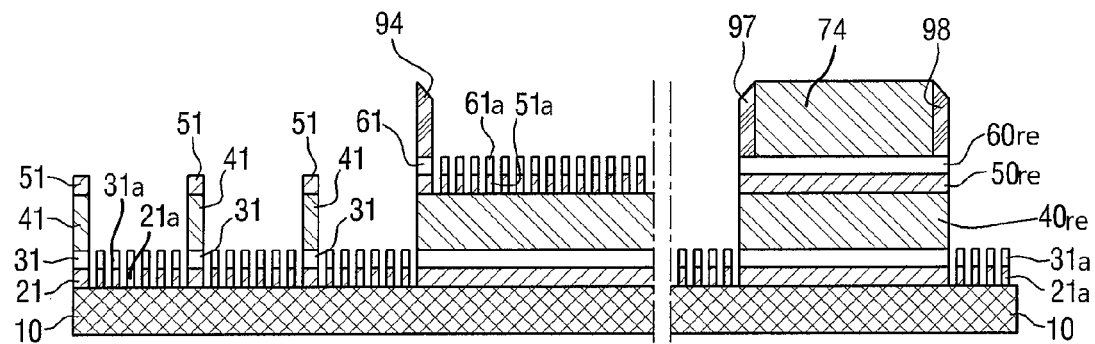
FIG. 26 is a cross-sectional view schematically illustrating an operation of forming first capping layer patterns and an operation of forming metal layer patterns after the operation of FIG. 25.

FIG. 26 is a cross-sectional view schematically illustrating an operation of forming first capping layer patterns and an operation of forming metal layer patterns according to the third embodiment. FIG. 26 is different from FIG. 9 in that second capping layer patterns 61 and 61a are formed in the entire non-aperture area.

Figure 27:
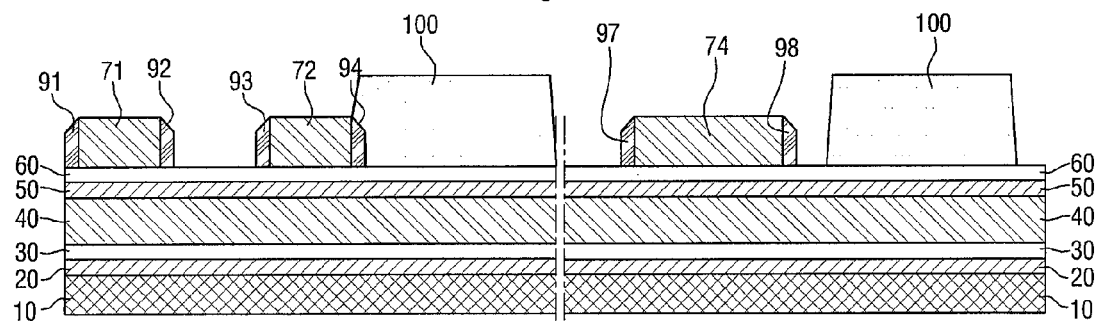
FIG. 27 is a cross-sectional view schematically illustrating an operation of forming a second alignment key pattern in an alignment key area using a second photoresist layer according to a fourth embodiment of the present invention.

FIG. 27 is a cross-sectional view schematically illustrating an operation of forming a second alignment key pattern in an alignment key area using a second photoresist layer 100 according to a fourth embodiment of the present invention.

FIG. 27 is different from FIG. 21 in that the second photoresist layer 100 is formed not on a sacrificial layer pattern 74 of the alignment key area but on a second capping layer 60. The second photoresist layer 100 may function as a mask used to form the second alignment key pattern in the alignment key area.

Figure 28:
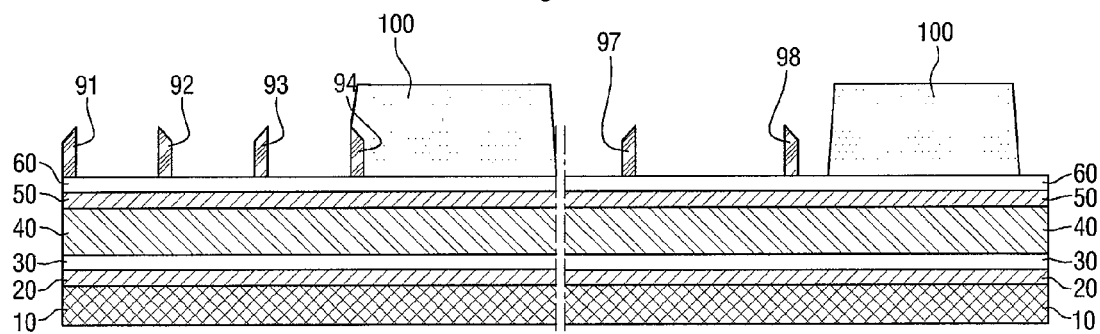
FIG. 28 is a cross-sectional view schematically illustrating an operation of removing sacrificial layer patterns after the operation of FIG. 27.

FIG. 28 is a cross-sectional view schematically illustrating an operation of removing sacrificial layer patterns 71 through 74 according to the fourth embodiment.

FIG. 28 is different from FIG. 22 in that the sacrificial layer pattern 74 of the alignment key area is removed together with the sacrificial layer patterns 71 and 72 of an aperture area.

Figure 29:
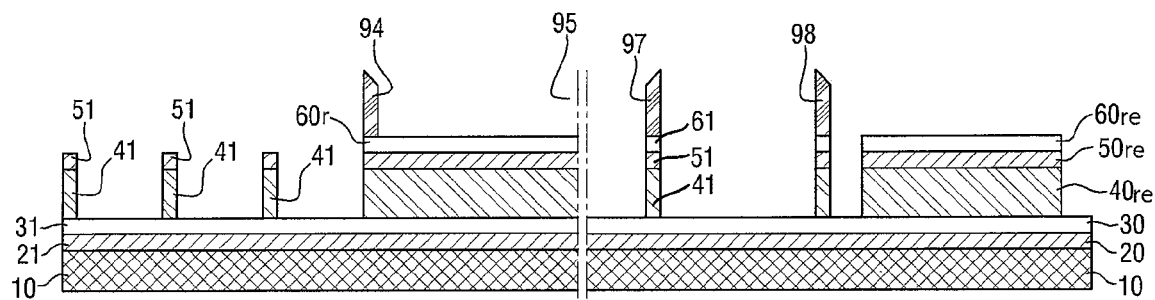
FIG. 29 is a cross-sectional view schematically illustrating an operation of forming guide patterns after the operation of FIG. 28.

FIG. 29 is a cross-sectional view schematically illustrating an operation of forming guide patterns 41 in the aperture area according to the fourth embodiment.

FIG. 29 is different from FIG. 23 in that only a second capping layer pattern 60re, a hard mask pattern 50re and a guide pattern 40re protected by the second photoresist layer 100 and a second capping layer pattern 61, a hard mask pattern 51 and a guide pattern 41 protected by auxiliary guide patterns 97 and 98 are formed on a first capping layer 30 in the alignment key area.

Embodiments of the present invention provide at least one of the following advantages.

Since a second photoresist layer is formed in an alignment key area before a sacrificial layer pattern is removed, the sacrificial layer pattern can be protected. Therefore, the sacrificial layer pattern protected by the second photoresist layer and layers under the sacrificial layer pattern may not be changed to have a fine line width even after the sacrificial layer pattern is removed and after a guide pattern is removed. Accordingly, the underlayers protected by the second photoresist layer can be used as a first alignment key pattern, and thus no alignment key recognition defect or error occurs when overlayers are aligned in a subsequent process to the fabrication of a polarizer. This can improve the alignment of the overlayers.

In addition, the second photoresist layer is formed in an area different from the area protected by the first photoresist layer pattern. Therefore, the underlayers protected by the second photoresist layer are not changed to have a fine line width even after the guide pattern is formed. Accordingly, the underlayers protected by the second photoresist layer can be used as a second alignment key pattern, and thus no alignment key recognition defect or error occurs when the overlayers are aligned in the subsequent process to the fabrication of the polarizer.

However, the effects of the present invention are not restricted to the one set forth herein. The above and other effects of the present invention will become more apparent to one of ordinary skill in the art to which the present invention pertains by referencing the claims.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation. Accordingly, it is to be understood that principles of this invention may be embodied other than as specifically described herein. The invention is also defined in the following claims, and equivalents thereof.

What is claimed is:

1. A method of fabricating a polarizer, the method comprising:
   forming a base substrate by sequentially forming a metal layer, a guide layer, a hard mask layer, a sacrificial layer, and a first photoresist layer on a light-transmitting substrate in a panel area and an alignment key area spatially separated from the panel area;
   forming a first photoresist layer pattern for forming an alignment key pattern in the alignment key area by patterning the first photoresist layer;
   forming a sacrificial layer pattern in the alignment key area utilizing the first photoresist layer pattern as a first mask; and
   forming a second photoresist layer on a top surface of the sacrificial layer pattern of the alignment key area before removing the sacrificial layer of an aperture area of the panel area.

2. The method of claim 1, further comprising:
   forming an auxiliary guide layer on the sacrificial layer pattern before the forming of the second photoresist layer on the top surface of the sacrificial layer pattern of the alignment key area; and
   exposing the top surface of the sacrificial layer pattern and the hard mask layer and forming an auxiliary guide pattern on side surfaces of the sacrificial layer pattern by partially etching the auxiliary guide layer.

3. The method of claim 2, further comprising maintaining the auxiliary guide pattern in the aperture area by removing a sacrificial layer pattern of the aperture area after the forming of the second photoresist layer.

4. The method of claim 1, wherein the forming of the second photoresist layer comprises forming the second photoresist layer in a non-aperture area of the panel area before removing the sacrificial layer of the aperture area.

5. The method of claim 1, further comprising:
   forming a first capping layer between the metal layer and the guide layer; and
   forming a second capping layer between the hard mask layer and the sacrificial layer.

6. The method of claim 1, further comprising, after removing the sacrificial layer:
   forming a guide pattern in the panel area by patterning the guide layer of the panel area utilizing an auxiliary guide pattern formed on the guide layer as a second mask;
   forming a self-assembly pattern in the panel area; and
   forming a metal layer pattern by patterning the metal layer of the aperture area utilizing the self-assembly pattern as a third mask.

7. The method of claim 6, wherein the forming of the self-assembly pattern comprises:
   coating a block copolymer, which comprises a first block and a second block, in the panel area and the alignment key area;
   heat-treating or solvent-annealing the block copolymer to produce the first block and the second block arranged alternately; and
   forming the self-assembly pattern by removing one of the first block and the second block.

8. The method of claim 6, further comprising removing all of the guide pattern, a hard mask pattern, the sacrificial layer pattern and the auxiliary guide pattern formed on the metal layer pattern, excluding the metal layer pattern.

9. A method of fabricating a polarizer, the method comprising:

forming a base substrate by sequentially forming a metal layer, a guide layer, a hard mask layer, a sacrificial layer, and a first photoresist layer on a light-transmitting substrate in a panel area and an alignment key area spatially separated from the panel area;

forming a first photoresist layer pattern for forming an alignment key pattern in the alignment key area by patterning the first photoresist layer;

forming a sacrificial layer pattern in the alignment key area utilizing the first photoresist layer pattern as a mask;

forming an auxiliary guide layer on the sacrificial layer pattern; and forming a second photoresist layer on the auxiliary guide layer in an area which overlaps the sacrificial layer pattern of the alignment key area before removing the sacrificial layer of an aperture area of the panel area.

10. The method of claim 9, wherein the forming of the second photoresist layer comprises forming the second photoresist layer in a non-aperture area before removing the sacrificial layer of the aperture area.

11. The method of claim 9, further comprising exposing a top surface of the sacrificial layer pattern and the hard mask layer in the aperture area and forming an auxiliary guide pattern on side surfaces of the sacrificial layer pattern by partially etching the auxiliary guide layer of the aperture area in a state where the second photoresist layer is maintained.

12. The method of claim 11, further comprising maintaining the auxiliary guide pattern in the aperture area by removing the sacrificial layer pattern from the aperture area.

13. A method of fabricating a polarizer, the method comprising:

forming a base substrate by sequentially forming a metal layer, a guide layer, a hard mask layer, a sacrificial layer, and a first photoresist layer on a light-transmitting substrate in a panel area and in an alignment key area spatially separated from the panel area;

forming a first photoresist layer pattern for forming an alignment key pattern in the alignment key area by patterning the first photoresist layer;

forming a sacrificial layer pattern in the alignment key area utilizing the first photoresist layer pattern as a mask; and forming a second photoresist layer on an auxiliary guide layer in an area which does not overlap the sacrificial layer pattern of the alignment key area before removing the sacrificial layer of an aperture area of the panel area.

* * * * *